United States Patent
Tajima et al.

(10) Patent No.: US 9,536,616 B1
(45) Date of Patent: Jan. 3, 2017

(54) NON-VOLATILE MEMORY DEVICE AND METHOD FOR READING OUT DATA

(71) Applicant: Kabushiki Kaisha Toshiba, Minato-ku (JP)

(72) Inventors: Hikari Tajima, Mitaka (JP); Masaki Kondo, Yokkaichi (JP); Tsukasa Nakai, Yokkaichi (JP); Takashi Izumida, Yokohama (JP); Nobutoshi Aoki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/969,382

(22) Filed: Dec. 15, 2015

Related U.S. Application Data (60) Provisional application No. 62/180,250, filed on Jun. 16, 2015.

(51) Int. Cl.
| | |
|---|---|
| *G11C 16/06* | (2006.01) |
| *G11C 16/26* | (2006.01) |
| *H01L 27/115* | (2006.01) |
| *H01L 29/423* | (2006.01) |

(52) U.S. Cl.
CPC .......... *G11C 16/26* (2013.01); *H01L 27/1157* (2013.01); *H01L 27/11582* (2013.01); *H01L 29/42344* (2013.01)

(58) Field of Classification Search
CPC ..... G11C 16/10; G11C 16/04; G11C 16/0483; G11C 16/16; G11C 16/3445; G11C 16/08; G11C 16/14; G11C 16/26; G11C 16/3495; G11C 8/14

USPC ............ 365/185.29, 185.18, 185.05, 185.11, 365/185.26, 185.3
See application file for complete search history.

(56) References Cited

U.S. PATENT DOCUMENTS

| 8,358,537 | B2 | 1/2013 | Morikado |
| 8,599,610 | B2 | 12/2013 | Nawata |
| 2015/0263031 | A1* | 9/2015 | Mikajiri ............ H01L 27/11578 257/326 |

FOREIGN PATENT DOCUMENTS

JP 2010-108548 5/2010

* cited by examiner

*Primary Examiner* — Thong Q Le
(74) *Attorney, Agent, or Firm* — Oblon, McClelland, Maier & Neustadt, L.L.P.

(57) ABSTRACT

A non-volatile memory device includes a first electrode layer, a second electrode layer adjacent to the first electrode layer, a third electrode layer adjacent to the second electrode layer, a fourth electrode layer adjacent to the third electrode layer, and a channel body extending through the first electrode layer, the second electrode layer, the third electrode layer and the fourth electrode layer in a first direction. The device further includes a circuit electrically connected to the first electrode layer, the second electrode layer, the third electrode layer, the fourth electrode layer, and the channel body. The circuit providing the second electrode layer with a first potential, the third electrode layer with a second potential higher than the first potential, the fourth electrode layer with a third potential between the first potential and the second potential and the channel body with a potential rising in the first direction.

12 Claims, 9 Drawing Sheets

NON-VOLATILE MEMORY DEVICE AND METHOD FOR READING OUT DATA

CROSS-REFERENCE TO RELATED APPLICATIONS

This application is based upon and claims the benefit of priority from U.S. Provisional Patent Application 62/180,250 filed on Jun. 16, 2015; the entire contents of which are incorporated herein by reference.

FIELD

Embodiments are generally related to a non-volatile memory device and a method for reading data.

BACKGROUND

In an NAND-type non-volatile memory device, reading out the data stored in the selected memory cell is executed by applying a voltage Vread to the control gate of each unselected memory cell and holding the control gate of the selected memory cell at the bias voltage equal to or lower than a threshold value. In some case, however, the bias applied to the unselected memory cells influences the selected memory cell and lowers the threshold voltage thereof. For example, the distance between the memory cells is narrowed in a highly miniaturized memory cell array, making such a threshold voltage drop significant, and deteriorates the read-out performance thereof. Thus, there is a demand for a read-out method capable of suppressing the threshold voltage drop in the selected memory cell.

BRIEF DESCRIPTION OF THE DRAWINGS

FIGS. 6A to 7B are schematic cross-sectional views showing an electric potential distribution of the non-volatile memory device according to the embodiment.

DETAILED DESCRIPTION

According to one embodiment, a non-volatile memory device includes a first electrode layer, a second electrode layer adjacent to the first electrode layer, a third electrode layer adjacent to the second electrode layer, a fourth electrode layer adjacent to the third electrode layer, and a channel body extending through the first electrode layer, the second electrode layer, the third electrode layer and the fourth electrode layer in a first direction. The device further includes a circuit electrically connected to the first electrode layer, the second electrode layer, the third electrode layer, the fourth electrode layer, and the channel body. The circuit providing the second electrode layer with a first potential, the third electrode layer with a second potential higher than the first potential, the fourth electrode layer with a third potential between the first potential and the second potential and the channel body with a potential rising in the first direction.

Various embodiments will be described hereinafter with reference to the following drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
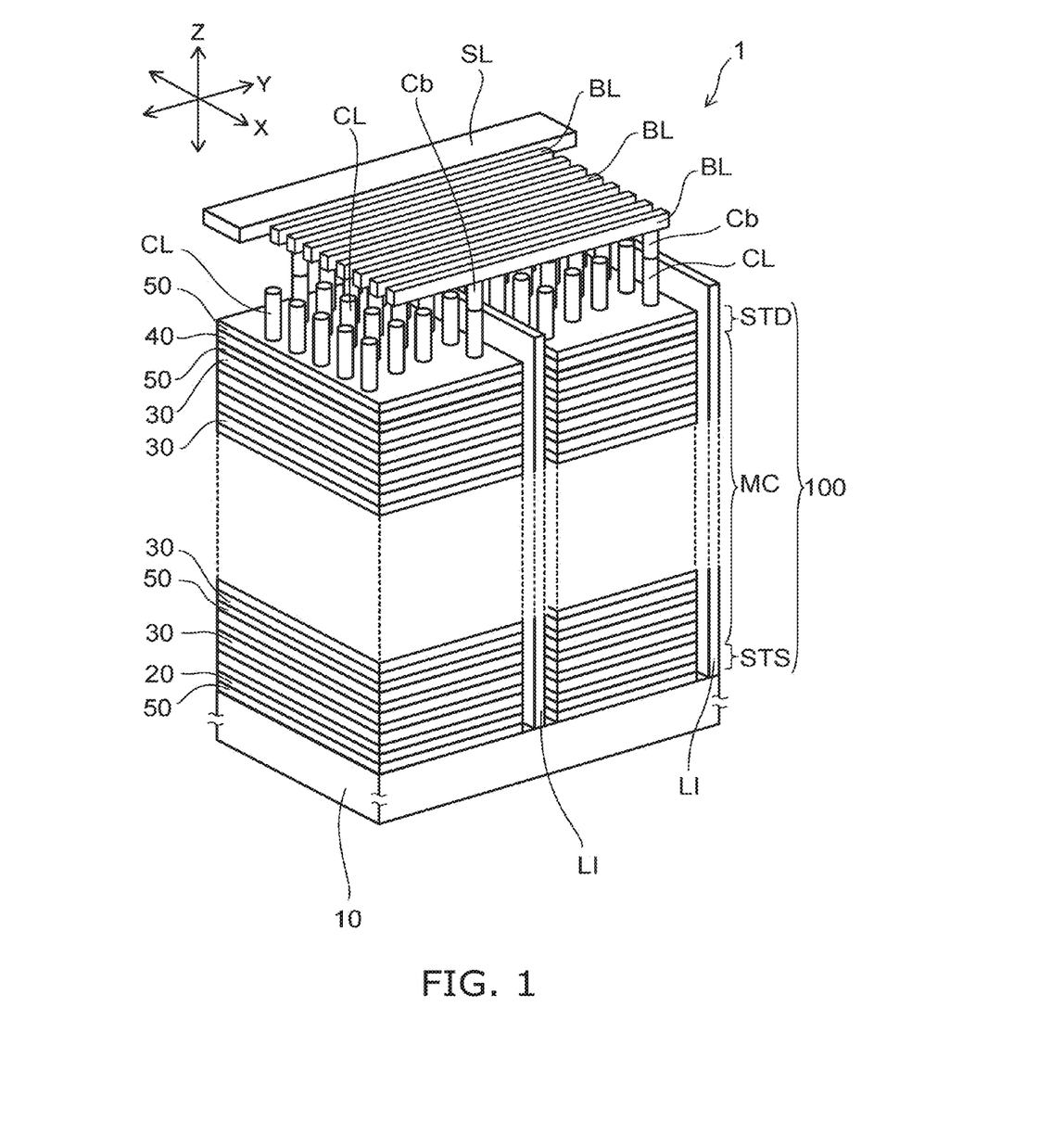
FIG. 1 is a perspective view schematically showing a non-volatile memory device according to an embodiment.

FIG. 1 is a perspective view schematically showing a memory cell array 1 of the non-volatile memory device according to an embodiment.

As shown in FIG. 1, the memory cell array 1 includes a source layer 10, stacked bodies 100 provided on the source layer 10, and an upper interconnects provided on the stacked bodies 100. The source layer 10 is, for example, a p-type well provided in a silicon substrate. The stacked bodies 100 are stacked on the source layer 10. The upper interconnects correspond to, for example, bit lines BL and a source line SL. In FIG. 1, graphical descriptions of insulating films are omitted between the stacked bodies 100 and the bit lines BL, and between the stacked bodies 100 and the source line SL.

The stacked bodies 100 each include an electrode layer 20, a plurality of electrode layers 30, an electrode layer 40 and a plurality of insulating films 50. The electrode layer 20, the plurality of electrode layers 30 and the electrode layer 40 are stacked in sequence in a Z-direction. The insulating films 50 are disposed between the source layer 10 and the electrode layer 20, between the electrode layer 20 and the electrode layer 30, between the electrode layers 30 adjacent to each other in the Z-direction, and between the electrode layer 30 and the electrode layer 40. The electrode layers 20, 30, and 40 are each a metal layer including at least one of tungsten (W), molybdenum (Mo), aluminum (Al), copper (Cu), and ruthenium (Ru), for example. The insulating films 50 each include, for example, silicon oxide or silicon nitride.

A plurality of bit lines BL and the source line SL are disposed above the stacked bodies 100. The bit lines BL each extend in a Y-direction, and are arranged in parallel to each other in an X-direction, for example. The source line SL extends in a Y-direction, and is arranged in parallel to the bit lines BL, for example.

The memory cell array 1 further includes a plurality of columnar sections CL, and electrically conductive members LI. The columnar sections CL extend through the stacked body 100 in a first direction (the Z-direction). The columnar sections CL each have, for example, a circular or elliptical shape in a cross-sectional surface perpendicular to the Z-direction. The columnar sections CL are disposed in a zigzag manner in a top view of the stacked body 100. Further, the columnar sections CL may also be disposed, for example, at regular intervals in the X-direction and the Y-direction. The stacked bodies 100 extend in, for example, the X-direction. The electrically conductive member LI extends in a space between the stacked bodies 100 adjacent to each other. The electrically conductive member LI extends in the Z-direction and the X-direction, for example. An insulating film not shown is disposed between the stacked body 100 and the electrically conductive member LI.

The source layer 10 is electrically connected to the source line SL via the electrically conductive member LI. The lower end of the electrically conductive member LI is in contact with, for example, the source layer 10. Further, the upper end of the electrically conductive member LI is electrically connected to the source line SL at a part not shown (see FIG. 3).

Figure 2:
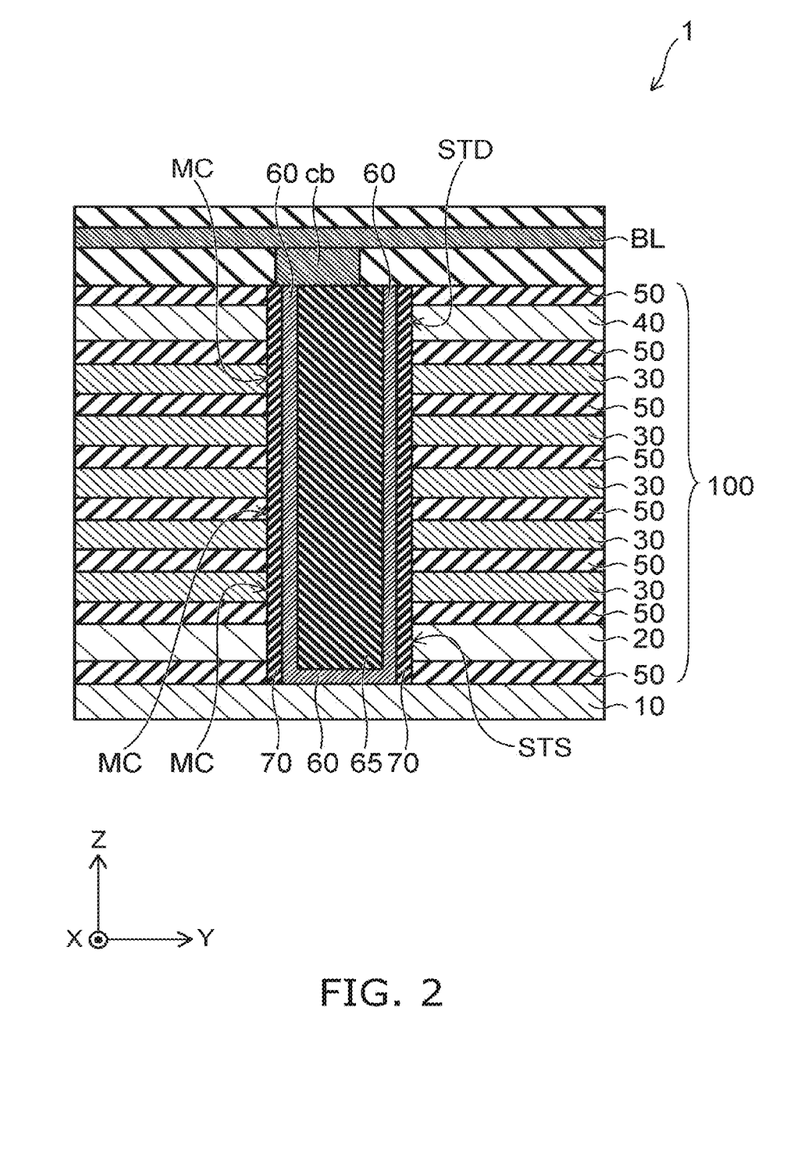
FIG. 2 is a schematic cross-sectional view showing the non-volatile memory device according to the embodiment.

FIG. 2 is a schematic cross-sectional view showing a cross-sectional surface of the columnar section CL. The columnar section CL includes a channel body 60, a memory film 70, and a core 65. The channel body 60 is a semiconductor layer made of, for example, silicon. The core 65 is an insulating body disposed in the channel body 60.

The channel body 60 is provided in the stacked body 100 so as to extend in the Z-direction. The channel body 60 is electrically connected to the bit line BL via the contact section Cb that is in contact with the upper end of the channel body 60. Further, the lower end of the channel body 60 is in contact with, for example, the source layer 10.

The memory film 70 is located between, for example, the channel body 60 and the electrode layer 30, and extends in the Z-direction. The memory film 70 is also located between the electrode layer 20 and the channel body 60, and between the electrode layer 40 and the channel body 60. The memory film 70 has a multilayer structure including a charge storage layer (see, e.g., FIG. 6A).

A memory cell transistor MC is provided at a part where the columnar section CL extends through each of the electrode layers 30. The memory cell transistors MC each include a first part of the channel body 60, a first part of the memory film 70, and the electrode layer 30. The electrode layers 30 act respectively as a control gate of a memory cell transistor MC. The memory cell transistors MC are disposed in the Z-direction along the columnar section CL. The number of the electrode layers 30 stacked in the Z-direction is equal to the number of the memory cell transistors MC arranged in the Z-direction.

A selection transistor STS on the source side is provided at a part where the columnar section CL extends through the electrode layer 20. The selection transistor STS includes a second part of the channel body 60, a second part of the memory film 70, and the electrode layer 20. The electrode layer 20 acts as a selection gate electrode, and the second part of the memory film 70 acts as the gate insulating film of the selection transistor STS.

A selection transistor STD on the drain side is provided at a part where the columnar section CL extends through the electrode layer 40. The selection transistor STD includes a third part of the channel body 60, the third part of the memory film 70, and the electrode layer 40. The electrode layer 40 acts as a selection gate electrode, and the third part of the memory film 70 acts as the gate insulating film of the selection transistor STD.

The columnar sections CL each include a NAND string. The NAND string includes a plurality of memory cell transistors MC arranged side by side in the Z-direction along the columnar section CL, and the selection transistors STS, STD. The plurality of memory cell transistors MC are disposed between the selection transistors STS and STD.

Figure 3:
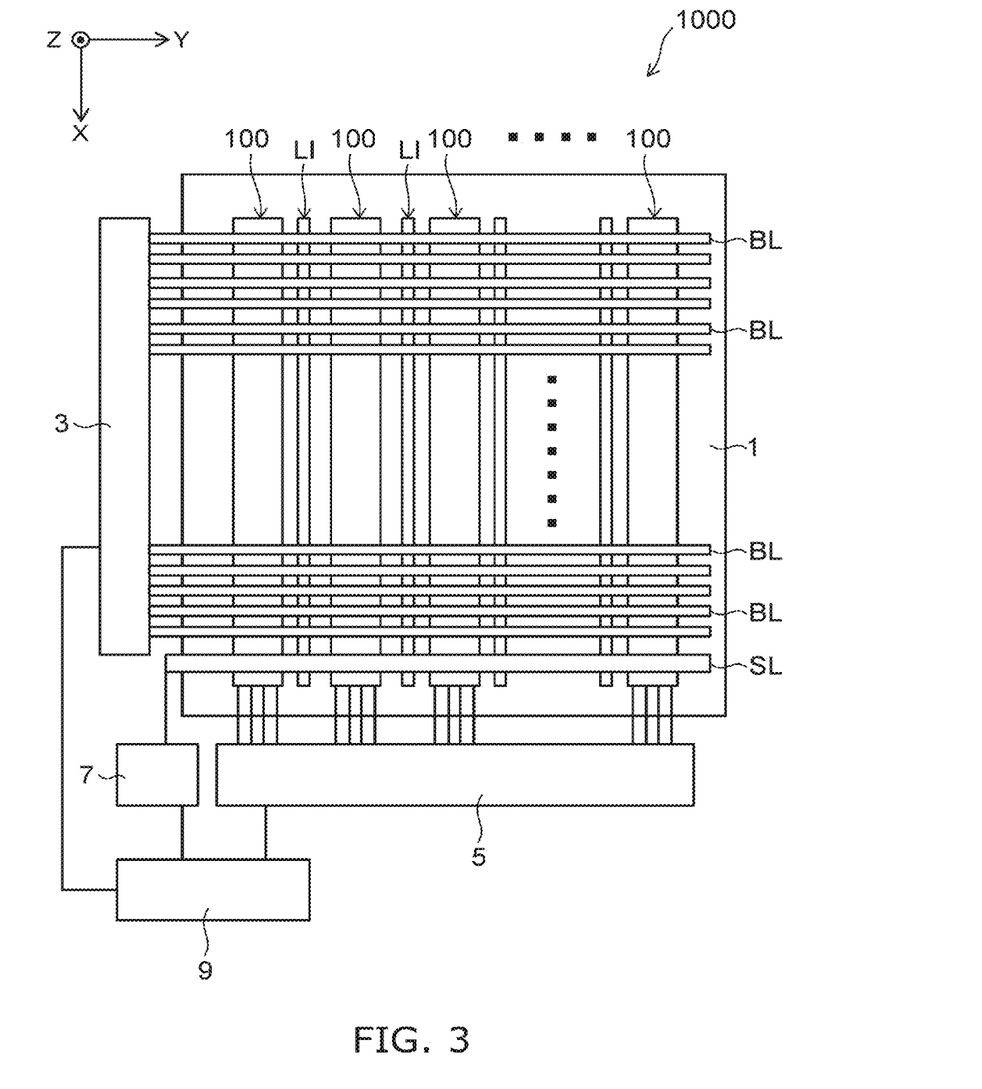
FIG. 3 is a plan view schematically showing the configuration of the non-volatile memory device according to the embodiment.

FIG. 3 is a plan view schematically showing the configuration of a non-volatile memory device 1000 according to the embodiment. The non-volatile memory device 1000 is provided with the memory cell array 1 and a peripheral circuit. The peripheral circuit includes, for example, a sense amplifier 3, a row decoder 5, a source potential supply section 7, and a controller 9.

The memory cell array 1 includes a plurality of stacked bodies 100 disposed in parallel to each other in the Y-direction, and the electrically conductive members LI respectively provided between the stacked bodies 100. The stacked bodies 100 and the electrically conductive members LI extend respectively in the X-direction. The bit lines BL each extends in the Y-direction over the plurality of stacked bodies 100, and the bit lines BL are arranged in parallel to each other in the X-direction.

For example, in each of the plurality of stacked bodies 100 disposed in parallel to each other in the Y-direction, a channel body 60 included in one of the columnar sections CL is electrically connected to one of the bit lines BL that extends in the Y-direction. In other words, the channel bodies 60 electrically connected to the one of the bit lines BL are respectively included in the columnar sections CL each extending through any one of the plurality of stacked bodies 100.

As shown in FIG. 3, the bit lines BL are electrically connected to the sense amplifier 3. The electrode layers 20, 30, and 40 included in each of the stacked bodies 100 are electrically connected to the row decoder 5. The source line SL is electrically connected to the upper ends of the electrically conductive members LI, and is further connected electrically to the source potential supply section 7.

The sense amplifier 3 applies a bias to the channel bodies 60 via the bit lines BL, and reads out the data stored in the memory cell transistors MC based on channel currents Ic flowing through the respective channel bodies 60. Further, the sense amplifier 3 temporarily holds the data read out from the memory cell transistors MC. The row decoder 5 arbitrarily applies a bias to each of the electrode layers 20, 30, and 40 to execute the data writing to the memory cell transistors MC and the data deleting from the memory cell transistors MC.

The controller 9 controls the sense amplifier 3, the row decoder 5, and the source potential supply section 7 based on, for example, a command provided from the outside, and makes the memory cell array 1 operate. The controller 9 can be provided outside the non-volatile memory device 1000.

Figure 4:
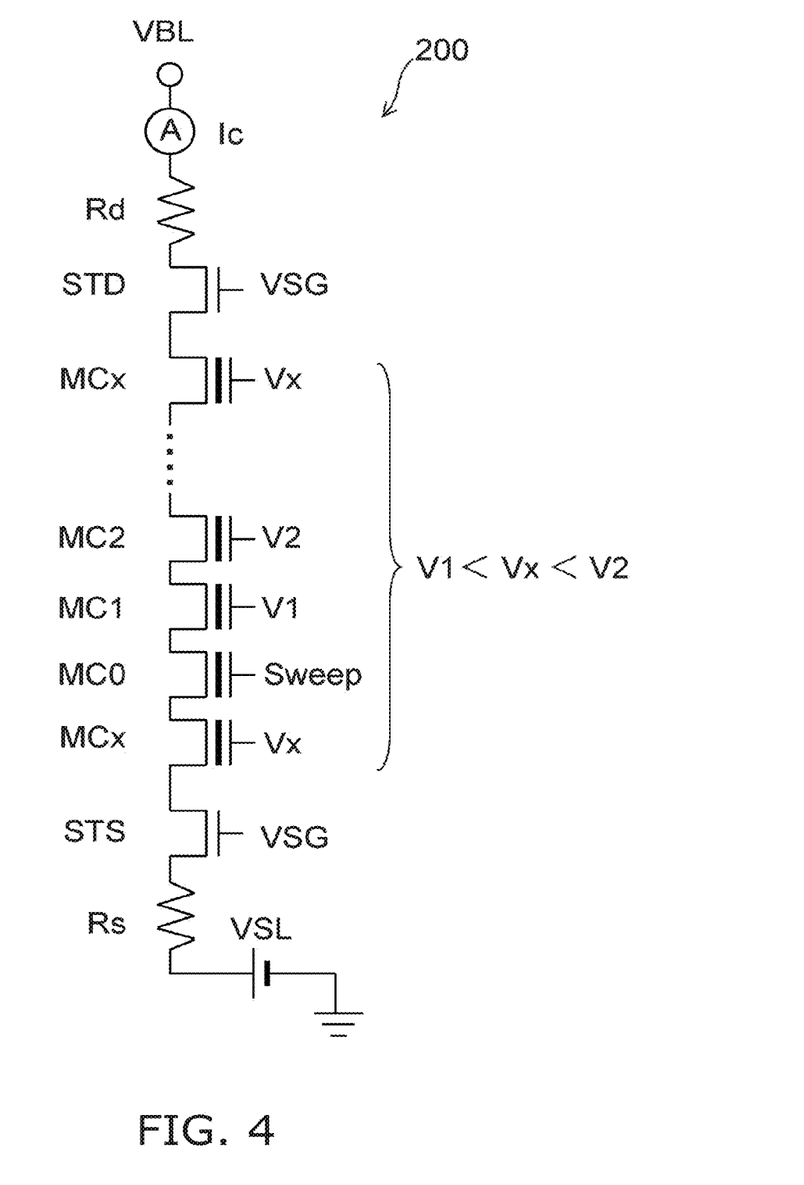
FIG. 4 shows an equivalent circuit of the non-volatile memory device according to the embodiment.
Figure 5:
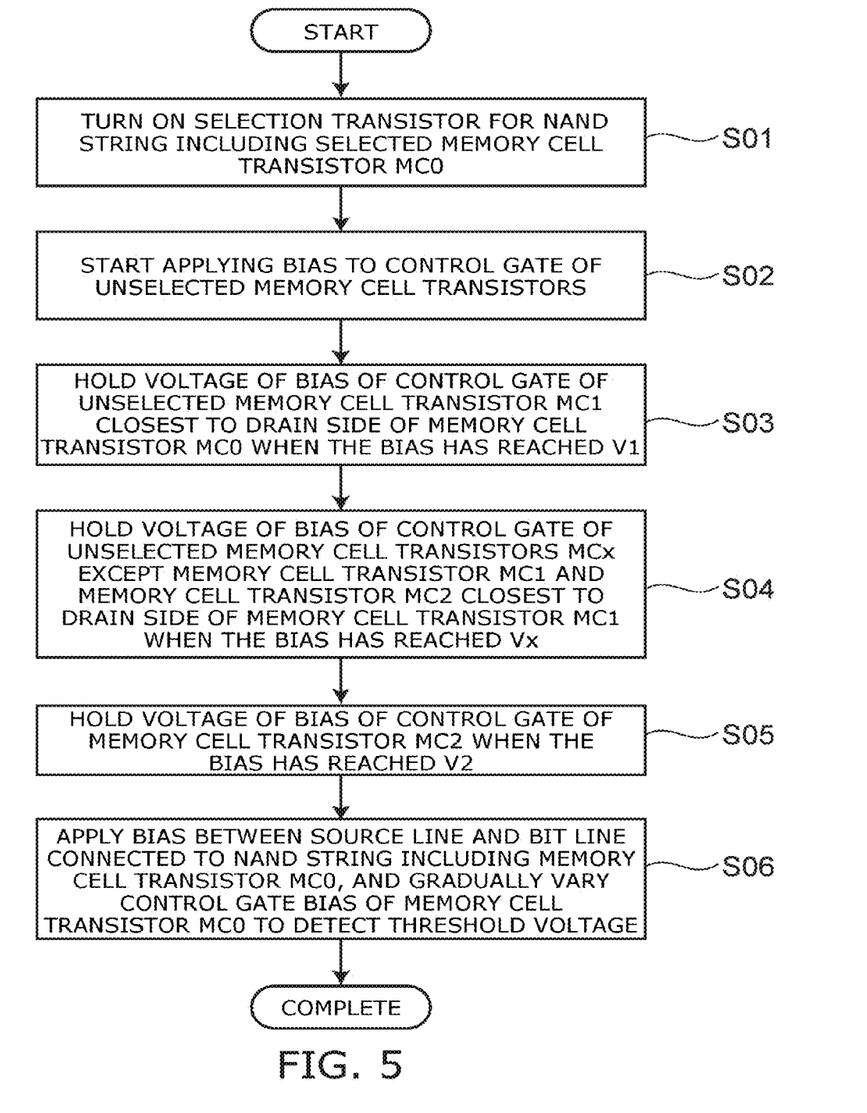
FIG. 5 is a flowchart showing a method for reading data of the non-volatile memory device according to the embodiment.

Then, with reference to FIG. 4 and FIG. 5, a data read operation of the non-volatile memory device 1000 will be explained. FIG. 4 is an equivalent circuit showing a NAND string 200 included in the columnar section CL. FIG. 5 is a flowchart showing a method for reading data of the non-volatile memory device according to the embodiment.

As shown in FIG. 4, the NAND string 200 includes the plurality of memory cell transistors MC arranged in the Z-direction, the selection transistor STS, and the selection transistor STD. The symbols Rd, Rs respectively denote a contact resistance on the drain side and a contact resistance on the source side.

The method for reading data according to the embodiment will hereinafter be explained in accordance with the flowchart shown in FIG. 5. For example, the controller 9 selects the memory cell transistor MC0 via the sense amplifier 3, the row decoder 5, and the source voltage supply section 7 to read out the data written in the memory cell transistor MC0.

Step S01: The row decoder 5 applies the bias VSG to the selection gates (the electrode layers 20, 40) of the selection transistors STS and STD of the NAND string 200 including the memory cell transistor MC0. Thus, the selection transistors STS, STD turn to an ON state.

Step S02: The row decoder 5 starts ramp up of, for example, a control gate bias (a bias of the electrode layer 30) of the unselected memory cell transistors MC1, MC2, and MCx.

The memory cell transistor MC1 is located at a position closest to the memory cell transistor MC0 on the drain side thereof. The memory cell transistor MC2 is located at another position closest to the memory cell transistor MC1 on the drain side thereof. The symbol MCx denotes the unselected memory cell transistors except the memory cell transistors MC1, MC2. Here, the drain side denotes the higher potential side in the part of the channel body 60 included in the memory cell transistor MC.

Step S03: When the control gate bias reaches V1, the row decoder 5 holds the control gate bias of the memory cell transistor MC1 in V1. The control gate bias V1 is higher than a threshold voltage of the memory cell transistor MC1.

Step S04: When the control gate bias reaches Vx, the row decoder 5 holds the control gate bias of the memory cell transistor MCx in Vx.

Step S05: When the control gate bias reaches V2, the row decoder 5 holds the control gate bias of the memory cell transistor MC2 in V2. The control gate biases of the unselected memory cell transistors MC are set to be in the relationship of V1<Vx<V2. The values V1, Vx, and V2 are set to values higher than the highest value of the threshold voltages Vth of the memory cell transistors MC to which data have been written, for example.

Step S06: The sense amplifier 3 applies the bias VBL to the bit line BL connected to the NAND string 200 including the memory cell transistor MC0. The source voltage supply section 7 holds the source potential in VSL. Here, VBL>VSL is fulfilled. Further, the row decoder 5 gradually varies the control gate bias of the memory cell transistor MC0 in a predetermined range. During this period, the sense amplifier 3 monitors the channel current Ic flowing through the channel body 60 to detect the threshold voltage at which the memory cell transistor MC0 turns ON, and store the data corresponding to the threshold voltage of the memory cell transistor MC0.

As described above, in the embodiment, when reading the data from the memory cell transistor MC0, the control gate biases V1, V2 of the two memory cell transistors MC1, MC2 located on the drain side of the memory cell transistor MC0 and the control gate bias Vx of other unselected memory cell transistors MCx are controlled so as to fulfill the relationship of V1<Vx<V2. Thus, the accuracy of reading the data from the memory cell transistor MC0 may be improved.

Figure 6A:
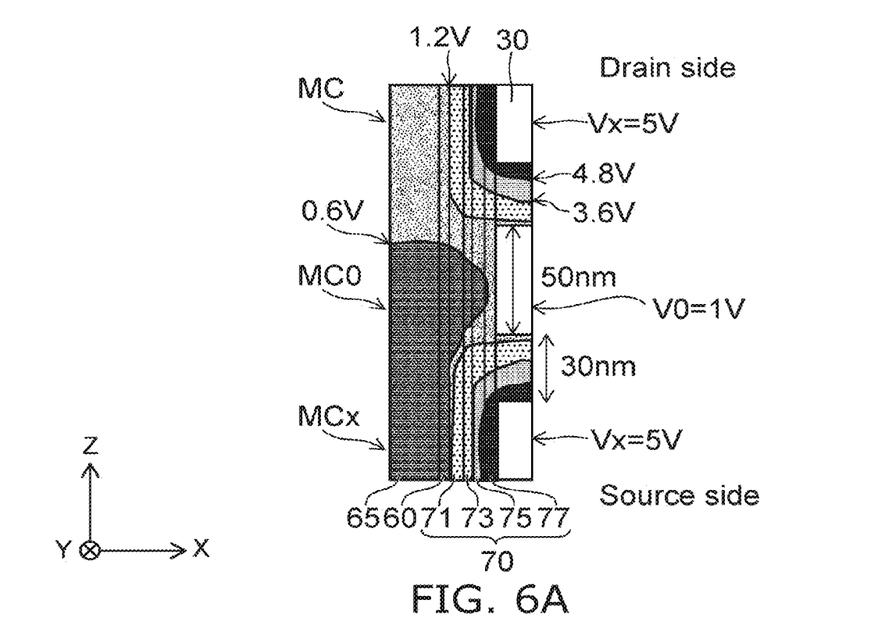
Figure 6B:
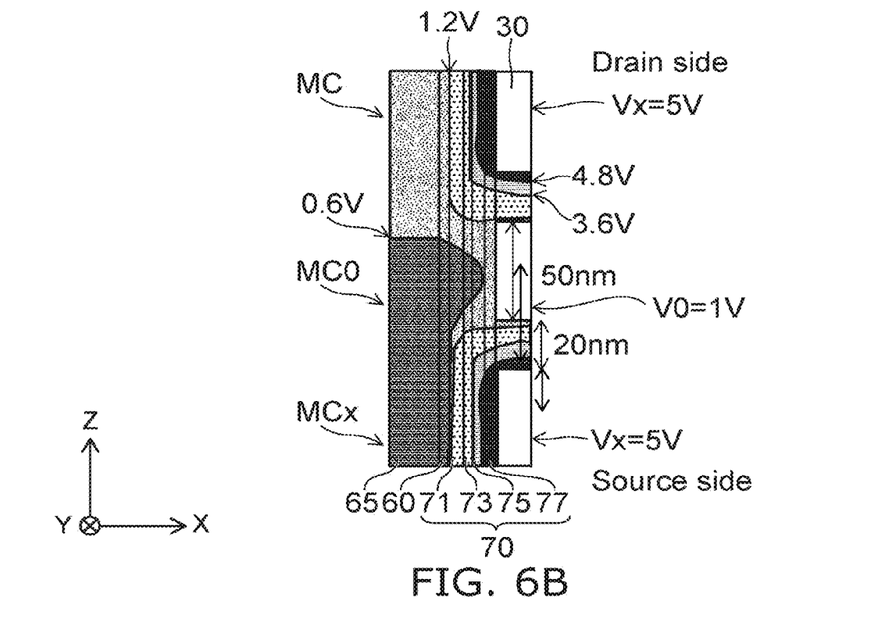
Figure 7A:
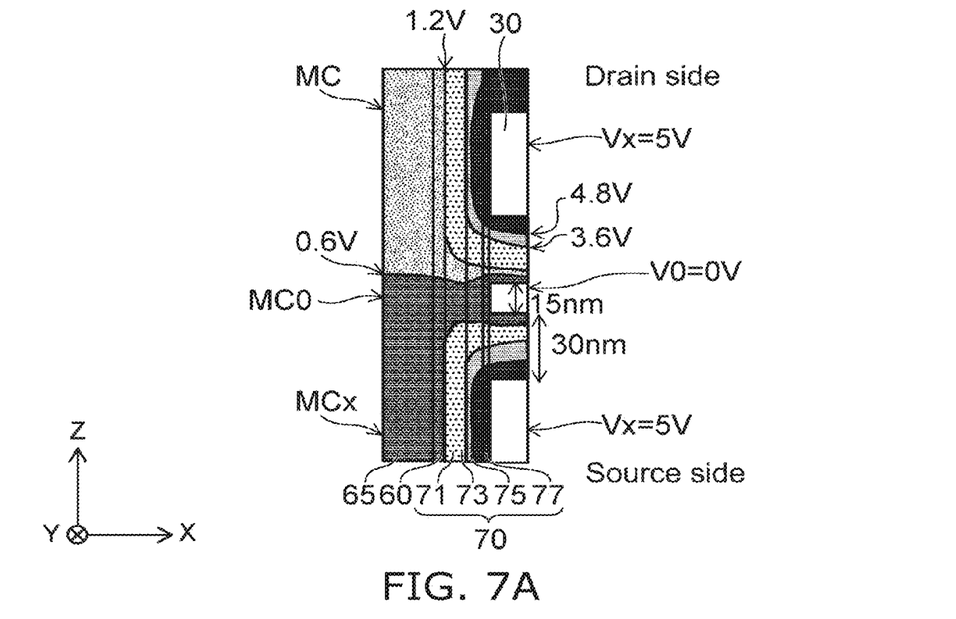
Figure 7B:
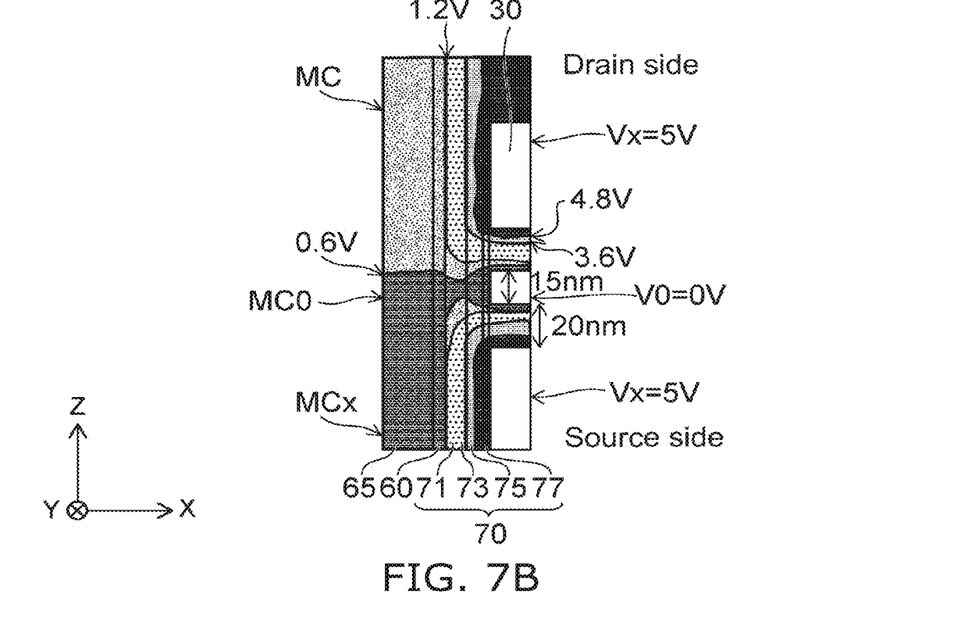

For example, FIGS. 6A to 7B are schematic cross-sectional views each showing an electric potential distribution of the memory cell transistor MC. FIGS. 6A and 6B show the case in which the width in the Z-direction of the electrode layer 30 is 50 nm. FIGS. 7A and 7B show the case in which the width in the Z-direction of the electrode layer 30 is 15 nm.

The memory film 70 includes, for example, a first film 71, a second film 73, a third film 75, and a fourth film 77 disposed in this order from the channel body 60 side. The first film 71 is, for example, a silicon oxide film, and acts as a tunnel insulating film. The second film 73 is, for example, a silicon nitride film, and acts as a charge storage layer. The third film 75 is, for example, a silicon oxide film. The fourth film 77 is a metal oxide film made of, for example, hafnium oxide. The third film 75 and the fourth film 77 act as, for example, an insulative blocking film.

The channel body 60 is a semiconductor layer provided so as to extend in the Z-direction. In this example, a source/drain region is not provided in the channel body 60 located between the memory cell transistors MC adjacent to each other in the Z-direction. Specifically, the channel body 60 has a first part facing the electrode layer 30 and a second part located between the memory cell transistors adjacent to each other, and the carrier concentration in the first part is equal to the carrier concentration of the second part. The second part faces the insulating film 50 via the memory film 70.

Further, the carrier concentration in the channel body 60 is, for example, equal to or lower than $1 \times 10^{17}$ cm$^{-3}$. Therefore, the electric potential distribution is generated in the channel body 60 and the memory film 70 due to the control gate bias applied to the electrode layer 30, and the electric potential distributions of the respective memory cell transistors adjacent to each other interfere with each other.

In the examples shown in FIGS. 6A to 7B, the potential VBL of the bit line BL is 0.5 V, and the source potential VSL is 0 V. Further, the number of the memory cell transistors MC disposed side by side in the Z-direction is 8, and Rd=Rs=830 kΩ is assumed.

FIG. 6A shows the electric potential distribution in the case in which the distance between the electrode layers 30 adjacent to each other in the Z-direction, i.e. the thickness Td in the Z-direction of the insulating film 50, is 30 nm. The control gate bias V0 of the memory cell transistor MC0 is 1 V, and the control gate biases V1, Vx of the unselected memory cell transistors MC1, MCx are 5 V.

It may be found in FIG. 6A that, for example, a part, where an equipotential plane of 0.6 V faces the electrode layer 30, is shifted in the Z-direction toward the source side from the center of the electrode layer 30. This shows that the interference by the potential of the memory cell transistor MC1 on the drain side is more significant than the interference by the potential of the memory cell transistor MCx on the source side.

FIG. 6B shows the electric potential distribution in the case where the thickness Td in the Z-direction of the insulating film 50 is 20 nm. The control gate bias V0 of the memory cell transistor MC0 is 1 V, and the control gate biases V1, Vx of the unselected memory cell transistors MC1, MCx are 5 V.

In FIG. 6B, for example, the part, where the equipotential plane of 0.6 V faces the electrode layer 30, is shifted in the Z-direction toward the source side from the center of the electrode layer 30. Further, the width of the part in the Z-direction, where the equipotential plane of 0.6 V faces the electrode layer 30, is narrowed compared to the example shown in FIG. 6A. This shows that the potential interference becomes more significant between the memory cell transistors MC1 and MCx, since the distance in the Z-direction between the electrode layers 30 is reduced.

FIG. 7A shows the electric potential distribution in the case where the thickness Td in the Z-direction of the insulating film 50 is 30 nm. In this example, the memory cell transistor MC0 comprises the electrode layer 30 having a width of 15 nm in the Z-direction. The control gate bias V0 of the memory cell transistor MC0 is 0 V, and the control gate biases V1, Vx of the unselected memory cell transistors MC1, MCx are 5 V.

In the electric potential distribution shown in FIG. 7A, for example, a region in the second film 73, where the potential is equal to or lower than 0.6 V, is shifted in the Z-direction toward the source side from the center of the electrode layer 30. This shows that the interference by the potential of the memory cell transistor MC1 on the drain side is more significant than the interference by the potential of the memory cell transistor MCx on the source side.

FIG. 7B shows the electric potential distribution in the case where the thickness Td in the Z-direction of the insulating film 50 is 20 nm. The control gate bias V0 of the memory cell transistor MC0 is 0 V, and the control gate biases V1, Vx of the unselected memory cell transistors MC1, MCx are 5 V.

In the electric potential distribution shown in FIG. 7B, for example, a region in the second film 73, where the potential is equal to or lower than 0.6 V, is shifted in the Z-direction toward the source side from the center of the electrode layer 30. Further, the region in the second film 73, where the potential is equal to or lower than 0.6 V, has a width in the Z-direction narrower than that in the example shown in FIG. 7A. This shows that the potential interference becomes more significant between the memory cell transistors MC1 and MCx, since the distance in the Z-direction between the electrode layers 30 is reduced.

Figure 8:
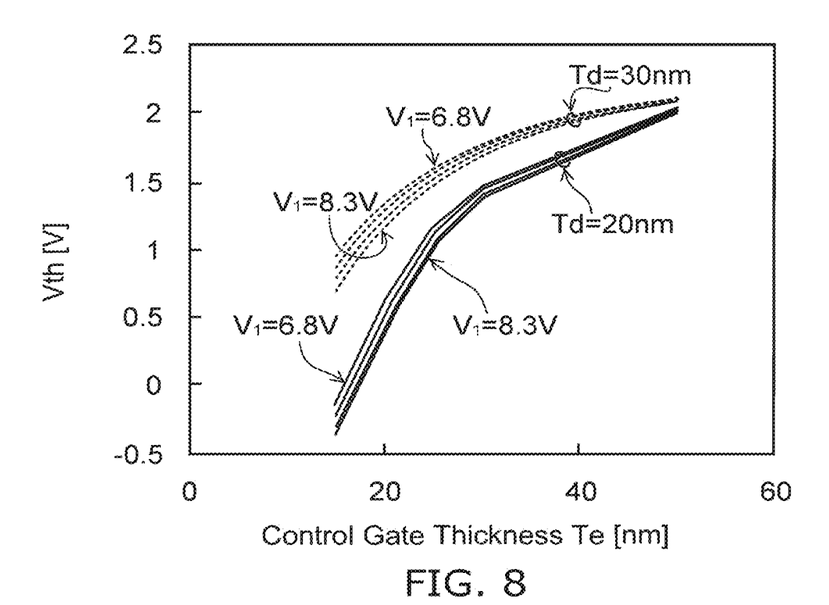
FIGS. 8 to 10 show graphs showing characteristics of the non-volatile memory device according to the embodiment.

FIG. 8 is a graph showing a relationship in the memory cell transistor MC0 between the thickness Te in the Z-direction of the control gate (the electrode layer 30) and the threshold voltage Vth. Further, FIG. 8 shows a change of the threshold voltage Vth, when the thickness Td in the Z-direction of the insulating film 50 is set to 20 nm or 30 nm, and the control gate bias V1 of the memory cell transistor MC1 is reduced from 8.3 V to 6.8 V. Here, the control gate bias Vx of other unselected memory cell transistors MCx is set to 8.3 V.

As shown in FIG. 8, as the thickness Te of the control gate is made thinner, the threshold voltage Vth of the memory cell transistor MC0 is lowered due to the influence by the potentials of the unselected memory cell transistors MC1 and MCx adjacent to the memory cell transistor MC0. The threshold voltage Vth where the thickness Td of the insulating film 50 is 20 nm becomes lower than the threshold voltage Vth where the thickness Td is 30 nm.

In contrast, the threshold voltage Vth of the memory cell transistor MC0 rises as the control gate bias V1 of the memory cell transistor MC1 is lowered from 8.3 V to 6.8 V, for example. That is, the influence of the potential with the threshold voltage of the memory cell transistor MC0 may be suppressed by lowering the control gate bias V1 of the memory cell transistor MC1.

Table 1 specifically shows a change of the threshold voltage Vth in the memory cell transistor MC0. When reducing the control gate bias of the memory cell transistor MC1 from 8.3 V to 6.8 V, the change of the threshold voltage Vth is 0.02 V in the case where the memory cell transistor MC0 has the control gate with the thickness Te of 50 nm, and the insulating film 50 has the thickness Td of 30 nm. In contrast, the change of the threshold voltage Vth is 0.23 V in the case where the memory cell transistor MC0 has the control gate with the thickness Te of 15 nm, and the insulating film 50 has the thickness Td of 20 nm. Thus, lowering the control gate bias V1 of the memory cell transistor MC1 provides more significant effect on the threshold bias Vth, as the miniaturization of the memory cell transistor MC proceeds.

TABLE 1

| Td [nm] | 30 nm | | 20 nm | |
|---|---|---|---|---|
| V1 [V] | 8.3 | 6.8 | 8.3 | 6.8 |
| Vth @ Te = 50 nm | 2.11 | 2.13 | 1.99 | 2.03 |
| Vth @ Te = 15 nm | 0.70 | 0.95 | −0.37 | −0.14 |

Figure 9:
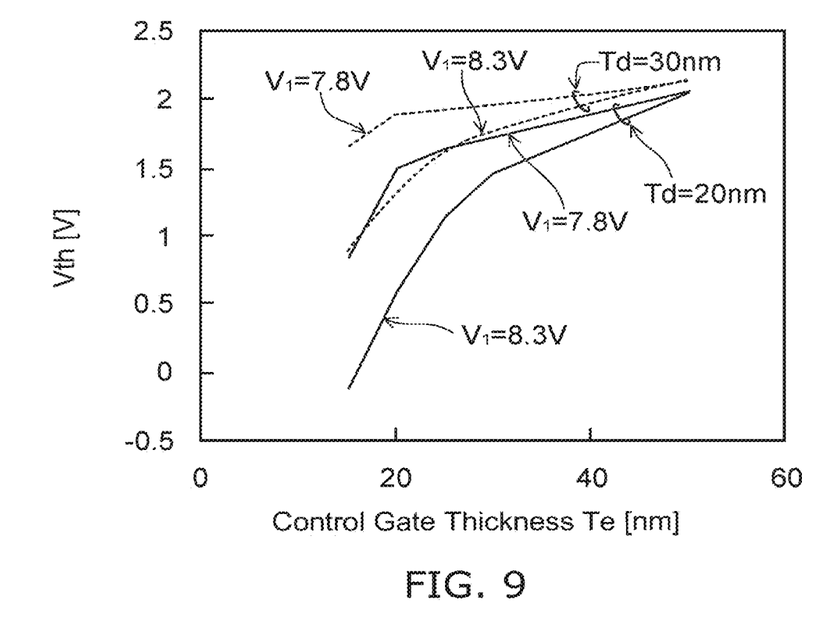

FIG. 9 is a graph showing a change in the threshold value Vth of the memory cell transistor MC0 in the case where data is stored in the memory cell transistor MC1. The horizontal axis represents a thickness Te of the control gate of the memory cell transistor MC0. The vertical axis represents a threshold voltage Vth of the memory cell transistor MC0. For example, it is assumed that the data written in the memory cell transistor MC1 raise the threshold voltage thereof to 7 V.

FIG. 9 shows the change of the threshold voltage Vth in the case where the thickness Td in the Z-direction of the insulating film 50 is set to 20 nm or 30 nm, and the control gate bias V1 of the memory cell transistor MC1 is reduced from 8.3 V to 7.8 V. When the control gate bias V1 is 8.3 V, the threshold voltage Vth has the same characteristic as the one shown in FIG. 8, and no influence by writing the data in the memory cell transistor MC1 is found therein. In contrast, when the control gate bias V1 is reduced to 7.8 V, the threshold voltage Vth is dramatically raised compared to the characteristics shown in FIG. 8, where the control gate bias V1 is set to 6.8 V. This rise of the threshold voltage Vth may be induced by a decrease of the channel current Ic.

Table 2 specifically shows the channel current Ic flowing through the channel body 60. When reducing the control gate bias V1 of the memory cell transistor MC1 from 8.3 V to 7.8 V, a difference between the threshold voltage Vth and the control gate bias V1 in the memory cell transistor MC1 decreases, and thereby, the channel current Ic decreases. As shown in Table 2, the channel current Ic decreases as much as about 60% from 98 nA to 40 nA in the case where the memory cell transistor MC has the control gate with the thickness Te of 50 nm, and the insulating film 50 has the thickness Td of 30 nm. In contrast, the channel current Ic decreases from 20 nA to 17 nA in the case where the memory cell transistor MC has the control gate with the thickness Te of 15 nm, and the insulating film 50 has the thickness Td of 20 nm, resulting in the decreasing rate of about 15%.

TABLE 2

| Td | 30 nm | | 20 nm | |
|---|---|---|---|---|
| V1 [V] | 8.3 | 7.8 | 8.3 | 7.8 |
| Ic [nA] @ Te = 50 nm | 98 | 40 | 97 | 39 |
| Ic [nA] @ Te = 15 nm | 19 | 16 | 20 | 17 |

As described above, when the data is stored in the memory cell transistor MC1, and the control gate bias V1 of the memory cell transistor MC1 is reduced to suppress the change of the threshold voltage Vth in the memory cell transistor MC0, the channel current Ic is decreased. Thus, in the method for reading data according to the embodiment, the control gate bias V2 of the memory cell transistor MC2, which is disposed at a position closest to the memory cell transistor MC1 on the drain side thereof, is set to be higher than the control gate bias Vx of other unselected memory cell transistors MCx, thereby reducing the threshold voltage in the memory cell transistor MC1. Thus, the decrease of the channel current Ic may be suppressed.

Figure 10:
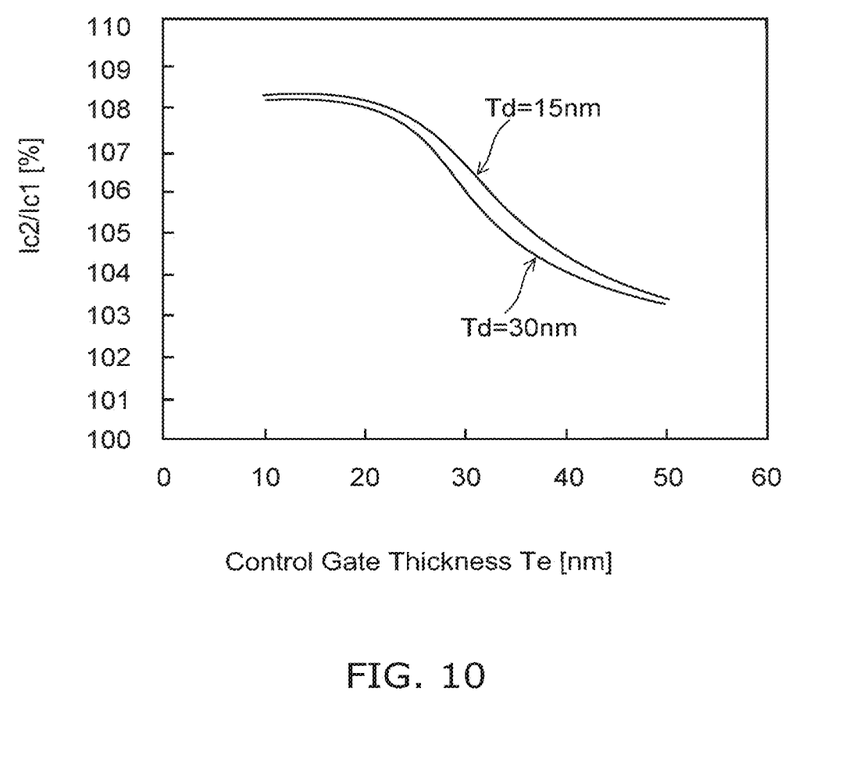

FIG. 10 is a graph showing a change ratio Ic2/Ic1 of the channel current Ic against the thickness Te of the control gate. Here, the symbol Ic1 denotes the channel current Ic in a case where the threshold voltage of the memory cell transistor MC1 is 7 V, V1=7.8 V and V2=8.3 V. In contrast, the symbol Ic2 denotes the channel current Ic in a case where the threshold voltage of the memory cell transistor MC1 is 7 V, V1=7.8 V and V2=10.3 V. As shown in FIG. 10, in the case where V2=10.3 V, the channel current Ic becomes larger than that in the case where V2=8.3 V, and the change ratio of Ic2/Ic1 becomes larger as the thickness Te of the control gate becomes smaller. Further, the change ratio of Ic2/Ic1 becomes larger, as the thickness Td of the insulating film 50 becomes smaller. Thus, increasing the control gate bias V2 of the memory cell transistor MC2 may provide more significant advantage, as the size of the memory cell transistor MC becomes smaller.

As described above, in the method for reading data according to the embodiment, the control gate biases V1, V2 of the two memory cell transistors MC1, MC2 adjacent to the selected memory cell transistor MC0 on the drain side thereof and the control gate bias Vx of other unselected memory cell transistors MCx are adjusted so as to fulfill the relationship of V1<Vx<V2. Thus, it is possible to suppress the change of the threshold voltage Vth in the memory cell transistor MC0, and further to suppress the decrease of the channel current Ic. As a result, the accuracy of reading the data from the memory cell transistor MC can be improved. Such a method for reading data as described above is advantageous in, for example, a non-volatile memory device comprising the multi-valued memory cell transistor. The control gate bias V1 is preferably set to be higher than the maximum threshold voltage in the memory cell transistors MC in which data is stored.

Further, the non-volatile memory device according to the embodiment is not limited to the examples described above. For example, each of the charge storage layers may be a conductive layer made of a semiconductor, metal, or the like, and discretely disposed along the channel body 60.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A non-volatile memory device comprising:
a first electrode layer;
a second electrode layer adjacent to the first electrode layer;
a third electrode layer adjacent to the second electrode layer in a first direction from the first electrode layer toward the second electrode layer;
a fourth electrode layer adjacent to the third electrode layer in the first direction;
a channel body extending through the first electrode layer, the second electrode layer, the third electrode layer, and the fourth electrode layer in the first direction;
a charge storage layer extending along the channel body;
a plurality of memory cell transistors each including a part of the charge storage layer provided between the channel body and each of the first electrode layer, the second electrode layer, the third electrode layer, and the fourth electrode layer; and
a circuit electrically connected to the first electrode layer, the second electrode layer, the third electrode layer, the fourth electrode layer, and the channel body,
the plurality of memory cell transistors including a first memory cell transistor provided at a part where the channel body extends through the first electrode layer,
the circuit including a first circuit portion and a second circuit portion, the first circuit portion providing the second electrode layer with a first potential, the third electrode layer with a second potential higher than the first potential, and the fourth electrode layer with a third potential between the first potential and the second potential, and
the second circuit portion providing the channel body with the potential rising in the first direction and reading out data from the first memory cell transistor.

2. The device according to claim 1, wherein
the second circuit portion reads out the data corresponding to a threshold voltage of the first memory cell transistor.

3. The device according to claim 1, further comprising:
a first insulating film provided between the first electrode layer and the second electrode layer, wherein
the channel body has a first part facing the first electrode layer via the charge storage layer, and a second part facing the first insulating film, and
a carrier concentration in the second part is equal to a carrier concentration in the first part.

4. The device according to claim 3, further comprising:
a second insulating film extending in the first direction along the channel body, and located between the charge storage layer and the channel body; and
a third insulating film provided between the charge storage layer and each of the first electrode layer, the second electrode layer, the third electrode layer and the fourth electrode layer.

5. The device according to claim 4, wherein
the charge storage layer includes a silicon nitride film, and each of the second insulating film and the third insulating film includes a silicon oxide film.

6. The device according to claim 1, wherein
the channel body includes a semiconductor.

7. The device according to claim 1, further comprising:
a substrate electrically connected to one end of the channel body; and
an interconnect electrically connected to the other end of the channel body,
wherein the first electrode layer, the second electrode layer, the third electrode layer, and the fourth electrode layer are stacked on the substrate.

8. The device according to claim 7, wherein
the first circuit portion and the second circuit portion are disposed on the substrate, and
the second circuit section is electrically connected to the channel body via the interconnect.

9. A non-volatile memory device comprising:
a first electrode layer;
a second electrode layer adjacent to the first electrode layer;
a third electrode layer adjacent to the second electrode layer in a first direction from the first electrode layer toward the second electrode layer;
a fourth electrode layer adjacent to the third electrode layer in the first direction;

a channel body extending through the first electrode layer, the second electrode layer, the third electrode layer, and the fourth electrode layer in the first direction;

a charge storage layer extending along the channel body;

a plurality of memory cell transistors each including a part of the charge storage layer provided between the channel body and each of the first electrode layer, the second electrode layer, the third electrode layer, and the fourth electrode layer; and a circuit electrically connected to the first electrode layer, the second electrode layer, the third electrode layer, the fourth electrode layer, and the channel body, the plurality of memory cell transistors including a first memory cell transistor and a second memory cell transistor, the first memory cell transistor being provided at a part where the channel body extends through the first electrode layer, and the second memory cell transistor being provided at another part where the channel body extends through the second electrode layer, the circuit providing the second electrode layer with a first potential, the third electrode layer with a second potential higher than the first potential, the fourth electrode layer with a third potential between the first potential and the second potential, and the channel body with a potential rising in the first direction, and the first potential is higher than a threshold voltage of the second memory cell transistor.

10. A method for reading data comprising:

applying a first potential to a second control gate electrode of a second memory cell transistor adjacent to a first memory cell transistor on a drain side of the first memory cell transistor, the first memory cell transistor including a first control gate electrode, and a charge storage layer disposed between a channel body and the first control gate electrode, and sharing the channel body with the first memory cell transistor;

applying a second potential higher than the first potential to a third control gate electrode of a third memory cell transistor adjacent to the second memory cell transistor on a drain side of the second memory cell transistor, the third memory transistor sharing the channel body with the second memory cell transistor;

applying a third potential between the first potential and the second potential to a fourth control gate electrode of a fourth memory cell transistor, the fourth memory cell transistor sharing the channel body with the third memory cell transistor; and detecting a threshold voltage of the first memory cell transistor by applying a varying potential in a predetermined range to the first control gate electrode.

11. The method according to claim 10, wherein the first potential is higher than a threshold voltage of the second memory cell transistor.

12. The method according to claim 10, wherein the first memory cell transistor, the second memory cell transistor, the third memory cell transistor, and the fourth memory cell transistor share the charge storage layer.

* * * * *